(12) United States Patent
Divigalpitiya et al.

(10) Patent No.: US 7,034,403 B2
(45) Date of Patent: Apr. 25, 2006

(54) DURABLE ELECTRONIC ASSEMBLY WITH CONDUCTIVE ADHESIVE

(75) Inventors: Ranjith Divigalpitiya, London (CA); David A. Kanno, London (CA); Patrice Jannic, Rueil-Malmaison (FR); Christophe Arnold, Chatou (FR); Richard Sabatier, Paris (FR); Glen Connell, Pine Springs, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 163 days.

(21) Appl. No.: 10/411,163

(22) Filed: Apr. 10, 2003

(65) Prior Publication Data

US 2004/0201112 A1  Oct. 14, 2004

(51) Int. Cl.
- H01L 23/48 (2006.01)
- H01L 23/52 (2006.01)
- H01L 29/40 (2006.01)

(52) U.S. Cl. ...................... 257/783; 257/782; 438/106; 438/118; 438/120

(58) Field of Classification Search ................ 257/782, 257/783; 438/106, 118, 120
See application file for complete search history.

(56) References Cited

U.S. PATENT DOCUMENTS

| | | | |
|---|---|---|---|
| 3,475,213 A | 10/1969 | Stow | |
| 4,113,981 A | 9/1978 | Fujita et al. | |
| 4,226,247 A | 10/1980 | Hauser et al. | |
| 4,457,796 A | 7/1984 | Needham | |
| 4,548,862 A | 10/1985 | Hartman | |
| 4,606,962 A | 8/1986 | Reylek et al. | |
| 4,737,112 A | 4/1988 | Jin et al. | |
| 5,240,761 A | 8/1993 | Calhoun et al. | |
| 5,300,340 A | 4/1994 | Calhoun et al. | |
| 5,415,717 A | 5/1995 | Perneborn | |
| 5,616,206 A | 4/1997 | Sakatsu et al. | |
| 5,665,212 A | 9/1997 | Zhong et al. | |
| 5,672,400 A * | 9/1997 | Hansen et al. | 428/40.1 |
| 5,725,707 A | 3/1998 | Koon et al. | |
| 5,817,374 A | 10/1998 | Detig et al. | |
| 5,851,644 A | 12/1998 | McArdle et al. | |
| 5,891,367 A | 4/1999 | Basheer et al. | |
| 5,916,641 A | 6/1999 | McArdle et al. | |
| 6,447,898 B1 | 9/2002 | Pfaff | |
| 6,451,418 B1 | 9/2002 | Tobita | |
| 6,646,350 B1 * | 11/2003 | Tanaka et al. | 257/759 |
| 6,884,833 B1 * | 4/2005 | Chheang et al. | 524/445 |
| 6,888,257 B1 * | 5/2005 | Wilson et al. | 257/783 |

(Continued)

FOREIGN PATENT DOCUMENTS

CA  452 052  10/1948

(Continued)

OTHER PUBLICATIONS

Lyons et al., "Electrically Conductive Adhesives", *Handbook of Adhesive Technology*, 1994, pp. 565-584.

(Continued)

Primary Examiner—Nathan J. Flynn
Assistant Examiner—Victor A. Mandala, Jr.
(74) Attorney, Agent, or Firm—Dean M. Harts

(57) ABSTRACT

An electronic assembly comprising a first electronic element, a second electronic element, and a durably flexible bond therebetween. The bond comprises an anisotropic conductive adhesive that includes elongated electrically conductive particles. The bond provides at least one electrical pathway between the first electronic element and the second electronic element through an elongated contact region. This bond is functionally maintained for at least about 200 flexes.

34 Claims, 2 Drawing Sheets

U.S. PATENT DOCUMENTS

| | | |
|---|---|---|
| 2002/0119255 A1 | 8/2002 | Divigalpitiya et al. |
| 2002/0158232 A1 | 10/2002 | Mitani et al. |
| 2003/0051807 A1 | 3/2003 | Yamaguchi et al. |
| 2003/0100654 A1* | 5/2003 | Chheang et al. ............ 524/445 |

FOREIGN PATENT DOCUMENTS

| | | |
|---|---|---|
| EP | 0 691 660 A1 | 1/1996 |
| EP | 0691660 * | 1/1996 |
| EP | 0 937 315 B1 | 9/2001 |
| EP | 1 219 693 A1 | 7/2002 |
| JP | 2002-198473 | 7/2002 |
| WO | WO 99/67088 | 12/1999 |
| WO | WO 00/01782 | 1/2000 |
| WO | WO 01/64807 A1 | 7/2001 |
| WO | WO 01/85358 | 11/2001 |
| WO | WO 02/067315 | 4/2002 |

OTHER PUBLICATIONS

International Standard ISO/IEC 10373-1, Identification cards—Test methods—Part 1: General characteristics tests, 1$^{st}$ Edition, Dec. 15, 1998, pp. 1-21.

International Standard ISO/IEC 10373-2, Identification cards—Test methods—Part 2: Cards with magnetic stripes, 1$^{st}$ Edition, Dec. 15, 1998, pp. 1-27.

International Standard ISO/IEC 10373-3, Identification cards—Test methods—Part 3: Integrated circuit(s) cards with contacts and related interface devices, 1$^{st}$ Edition, Feb. 15, 2001, pp. 1-80.

* cited by examiner

DURABLE ELECTRONIC ASSEMBLY WITH CONDUCTIVE ADHESIVE

TECHNICAL FIELD

This invention relates to electronic assemblies comprising electronic elements and a durably flexible bond provided by an anisotropically conductive adhesive.

BACKGROUND

Flexible circuits are bonded with conductive adhesives and tested for proper electrical connections. The bonding area is held rigid during manufacture and use such that little or no adverse stress is placed on the bond. The applications are designed to deliberately avoid flexing the bonded region.

Structural adhesives are desired for the bond strength and tamper resistance, but are usually brittle (high glass transition temperature) and do not provide the durability demanded during usage of newer electronic devices, and further usually are not conductive.

Electrically conductive adhesive sheets have been described, for example with rigid spacer particles to maintain adhesive thickness when the adhesive is bonded. Anisotropic adhesives have been described, for example with spherical particles or regions having electrical conductivity through the thickness via patterning.

SUMMARY

Briefly, the present invention provides an electronic assembly comprising a first electronic element, a second electronic element, and a durably flexible bond therebetween, said bond comprising an anisotropic conductive adhesive which comprises elongated electrically conductive particles, and at least one electrical pathway between the first electronic element and the second electronic element provided by an elongated contact region, said bond being functionally maintained for at least about 200 Flexural Cycles.

The invention also provides a method of manufacturing an electronic device comprising providing the electronic assembly just described, wherein the adhesive is curable and curing the adhesive, or wherein the adhesive is non-curing and bonding the adhesive to the electronic elements.

As used herein, "major dimension" means the largest of a particle's diameter, length, width, cross-section, or thickness, and "minor dimension" means the smallest of a particle's diameter, length, width, cross-section, or thickness, where both major and minor dimensions can be directly measured or classified by standard screening techniques, particle sizing equipment, or supplier descriptions;

"functionally maintained" means that the adhesion between the electronic elements is not significantly adversely affected and the structural integrity of the electronic assembly involving this bond is maintained and, concurrently, at least one electrical pathway between the first electronic element and the second electronic element is maintained for at least a portion of a Flexural Cycle (defined below), i.e., at least one bend in at least one mode; and "Flexural Cycle" means one set of bends in each of four modes: one up and one down in the length (x-direction) of an industry standard sample smart card (having dimensions of about 8.5 cm length, about 5.4 cm width, and about 0.8 mm thickness), and one up and one down in the width (y-direction) of the same sample card, and a useful apparatus and more detailed procedure are described below.

The electronic assembly of the present invention includes a durably flexible bond, while prior electrically conductive adhesive bonding required a rigid region.

Other features and advantages of the invention will be apparent from the following more detailed description of the invention and the claims. The above summary of principles of the disclosure is not intended to describe each illustrated embodiment or every implementation of the present disclosure. The detailed description that follows more particularly exemplifies certain presently preferred embodiments using the principles disclosed herein.

DETAILED DESCRIPTION

Figure 1:
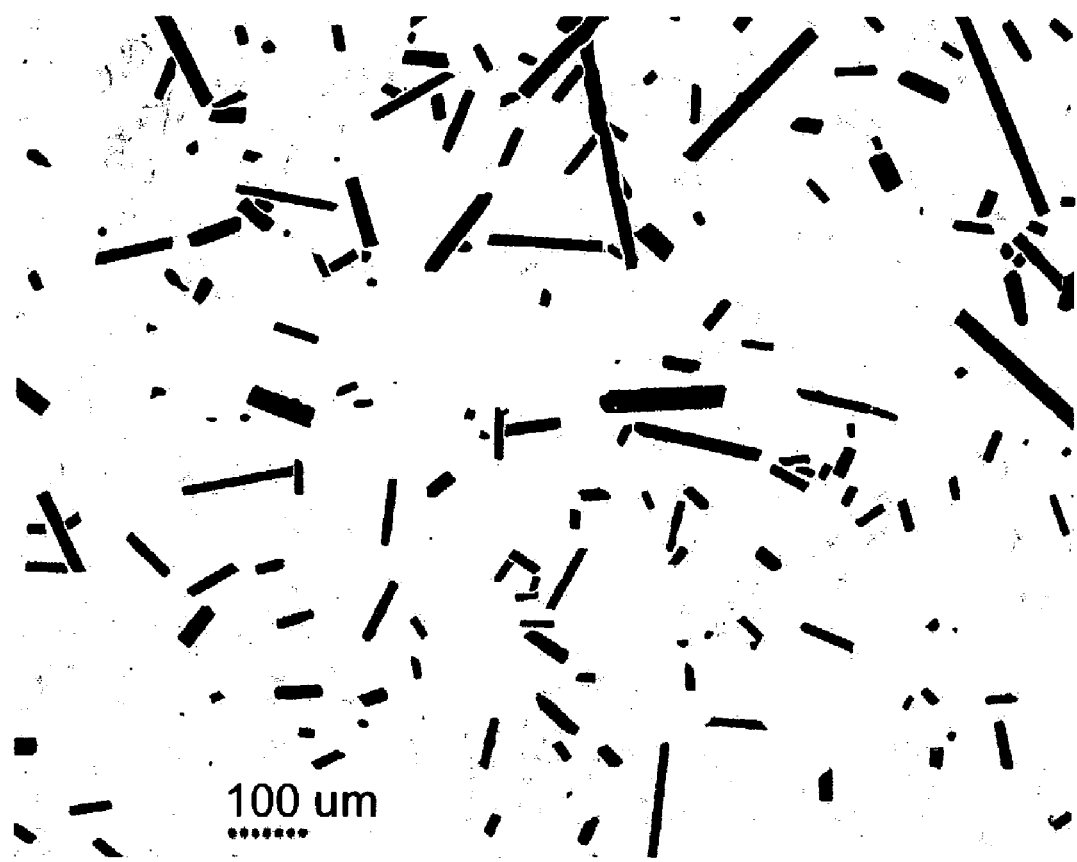
FIG. 1 is a digital image of an optical photomicrograph of an adhesive surface useful in the present invention taken in transmission mode.

All numbers are herein assumed to be modified by the term "about." The recitation of numerical ranges by endpoints includes all numbers subsumed within that range (e.g., 1 to 5 includes 1, 1.5, 2, 2.75, 3, 3.80, 4, and 5).

The present invention provides an electronic assembly comprising a first electronic element, a second electronic element, and a durably flexible bond therebetween. The bond comprises an anisotropic conductive adhesive that includes elongated electrically conductive particles. The bond also provides at least one electrical pathway between the first electronic element and the second electronic element through an elongated contact region. The bond is functionally maintained for at least about 200 Flexural Cycles.

Any known electronic elements may be used. Particular selection is further guided by this document. For example, a flexible circuit may be attached to a rigid circuit, two flexible circuits may be attached together, etc. In particular, electronic elements can be integrated circuits, integrated circuit chip contacts, flexible or partially flexible or rigid electronic circuits, smart cards, radio frequency devices such as radio frequency identification (RFID) tags, portable electronic devices such as mobile phones, personal digital assistants, cameras, simple or complex computers, timers, and combinations thereof.

The durably flexible bond is used to electrically connect the electronic elements via at least one electrical pathway and through an elongated contact region. In addition, two or more elongated contact regions may be provided. Preferably, a plurality of contact regions is used on each electronic element to provide electrical contact throughout the desired duration of the contact, which may be the desired life of the electronic assembly. The bond comprises an anisotropic conductive adhesive, which adhesive includes elongated electrically conductive particles.

Anisotropically conductive adhesive materials in the present invention provide discrete electrical interconnections (preferably via more than one elongated particle per contact region) between the electronic elements while also providing electrical isolation from the adjacent regions. For example, such an adhesive usually is conductive through its thickness while being laterally non-conductive.

The base composition of the adhesive may be thermoplastic or curable, or a combination thereof. As used herein, "thermoplastic" refers to a material that undergoes a physical change upon the application of heat, i.e., the material softens and may flow with heat and returns to its initial non-flowing state upon cooling. A combination of thermoplastic and curable materials may involve a thermoplastic material that undergoes a physical change and chemical change upon the application of heat, i.e., the material softens and may flow upon the application of heat and returns to its initial non-flowing state upon cooling. While a thermoplastic material may again be heated to allow it to soften or flow again, the combination material usually flows less or may not flow again under heat. Suitable thermoplastics include polyesters and copolymers thereof, polyamides, co-polyamides, polyether-co-polyamides, polyester-co-polyamides, and combinations thereof. Polyester blends are presently preferred.

The adhesive may be selected from several classes such as hot melt, pressure sensitive, structural adhesive, curable, and combinations thereof. As used herein, "structural adhesive" means that the material is able to retain adhesion properties under long-term stress to permanent stress (e.g., days, weeks, months, or longer), and preferably while at service conditions that may be elevated temperature and/or humidity. In one embodiment, the adhesive preferably does not flow to a degree that impairs the intended function. When the adhesive is curable, the curing reaction preferably is rapid, such as one occurring in less than 30 seconds, more preferably less than about 15 seconds, even more preferably about 10, 8, or 5 seconds or even less. The curing reaction may proceed faster at elevated temperature, such as above about 100° C., more preferably above about 150° C. The maximum curing temperature is preferably below the level at which surrounding materials are adversely affected. In one aspect this temperature is below about 220° C., more preferably below about 210° C., or even below about 200° C.

In one aspect, the glass transition temperature (Tg) of the adhesive does not change by more than 25° C. (more preferably less than about 10° C.) after curing.

In one aspect, the adhesive has a storage shear modulus selected from below about 100 MPa, below about 75 MPa, and below about 50 MPa. Such properties are measured via known techniques such as the rheological test described below.

The adhesive may include a combination of thermoplastic, curable such as thermosetting, and/or elastomeric materials. In one aspect, the adhesive comprises from about 30 to about 70 parts by weight (pbw) of an elastomer (more preferably from about 30 to about 60 pbw) and correspondingly from about 70 to 30 pbw of a thermosetting polymer (more preferably at least about 40 or even 50 pbw). For example, the adhesive may comprise from about 45 to about 60 pbw of an elastomer and at least about 40 pbw of a curable polymer. The adhesive also may comprise an elastomer and a thermoplastic polymer, optionally with a thermosetting polymer.

Suitable elastomers include natural and synthetic rubbers, butyl rubber, nitrile rubbers, synthetic polyisoprene, ethylene-propylene rubber, ethylene-propylene-diene monomer rubber (EPDM), polybutadiene, polyisobutylene, poly(alpha-olefin), styrene-butadiene random copolymer, fluoroelastomers, silicone elastomers, and combinations thereof. Such elastomers include poly(butadiene-co-acrylonitrile) copolymers.

Suitable curable materials include acrylic resins, epoxy resins, polyurethane resins, phenolic resins, phenolic novolac resins, silicones, and combinations thereof, including hybrid materials involving copolymers of such resins. Any known curing mechanism such as heat, light, UV, radiation, moisture can be used, and particular selection is within the skill of the art. In the case of smart cards, one preferred curing mechanism is heat.

Suitable adhesives also include known hybrid materials such as moisture-cured materials, and pressure sensitive curable materials.

When a phenolic resin is involved, this resin optionally may include hexamethylenetetramine (HMTA). The content of HMTA ranges from at least about 5% or 6% by weight based on phenolic resin weight (wt %), up to below about 15% or even below about 10%. The free phenol level in the resin may range from below about 2 wt %, more preferably below about 1% or even below about 0.2%.

In one aspect, suitable phenolic resins have a melting point between about 90 and about 110° C.

Tackifiers may also be included in the anisotropic adhesive, such as rosin and rosin derivatives, polyterpenes, coumarone indenes, aromatic hydrocarbon resins, aliphatic hydrocarbon resins, hydrogenated resins and hydrocarbon resins, for example: alpha pinene-based resins, beta pinene-based resins, limonene-based resins, piperylene-based hydrocarbon resins, esters of rosins, polyterpene, terpene-phenolics, and styrene-maleic anhydrides. Typically, the tackifier comprises from about 10 to about 200 parts by weight per 100 parts by weight of the base adhesive material.

Optionally, the adhesive also may include additives, such as other fillers, spacer particles, anti-oxidants, UV-stabilizers, corrosion inhibitors, reinforcing materials, and thermally conductive particles.

The anisotropically conductive adhesive component of the present invention can be made by any known method. Particles preferably are evenly distributed in the adhesive, such as via any known mixing technique such as blending the particles into a liquid adhesive, melt processing, or via sprinkling particles through a screen. For example, adhesives having elongated particles such as fibers can be made by several known methods such as die coating a blend of fibers with the selected adhesive composition, or pry-coating the adhesive onto a liner, substrate, electronic element, or carrier film and dispersing the conducting fibers onto the adhesive using a screen device. For another example, particle dispensers such as flour sifters or salt shakers are commonly used in dispersing fine particles. A suitable particle dispenser can be used wherein for example either agitation or a sweeping member is used to dispense particles through a screen, which screen has holes of a suitable size, moving the sweeping member across the screen. An example of such a process is described in U.S. Patent No. 6,569,494, the disclosure of which is herein incorporated by reference, and where the optional extra step of electrically charging the conducting particles can be used to keep particles separated from each other. Also, pressing or nipping of the adhesive layer, sheet, or web containing the fibers with a roller or between two rollers can further embed dispersed particles.

In one embodiment, conducting fibers are anchored or partially buried in the adhesive it such that part of the fiber is exposed to the environment before bonding. This may allow the construction to act as plurality of small spring-loaded electrical contacts. After bonding, the fibers lie within the plane of the bond and preferably within the thickness of the adhesive.

FIG. 1 is a digital image of an optical photomicrograph showing dispersed (8 SA % in this image) elongated electrically conductive elongated particles in an adhesive base.

The level of electrically conductive particles is selected to provide electrically conductivity in the desired direction (typically thickness or z-direction) while providing lateral electrical isolation (non-conducting in the x- and y-directions). The level of electrically conductive particles preferably is selected to provide multiple particles for each contact region. For example, in one aspect a particle density of at least about six (more preferably at least about 30) particles per contact region or pad. Electrical contact pad size ranges from very small (e.g., under about 0.5 mm$^2$), to relatively large (e.g., up to about 9 mm$^2$), with an average for smart cards of around 4 mm$^2$).

One measure of the level of particles is surface area percent (SA %) covered. In this measure, digital images (taken through the adhesive thickness) of randomly selected areas are examined, preferably with the aid of image processing software, to determine the area covered by the particles relative to the area of adhesive without particles. The particle area divided by the total area yields the surface area percentage. In the present invention, the level of electrically conductive particles in the adhesive is at least about 5 SA %, more preferably at least about 10 SA %. In the present invention, the level of electrically conductive particles in the adhesive is below about 50 surface area percent (SA %), more preferably at least about 40 SA %, more preferably below about 30 SA %.

The level of particle surface area coverage typically ranges from about 1 SA % to about 30 SA % (more preferably from about 5 SA % to about 15 SA %) of the adhesive matrix. The lower level should provide at least about 6 particles per pad and the upper level should be below the level at which percolation or an undesirable level of x-y plane conductivity occurs.

Generally the major dimension of the elongated particles ranges from about 10 to about 500 μm, more preferably from about 30 μm to about 250 μm. Generally the maximum dimension of the elongated particles on an average particle size basis ranges from about 15 to about 200 μm, more preferably from about 30 μm to about 180 μm. Generally the minor dimension of the elongated particles ranges from about 5 to about 100 μm, more preferably from about 10 μm to about 50 μm.

The elongated particles have a high aspect ratio, for example non-spherical particles, elliptical particles, fibers (including whiskers and needles), flakes and combinations thereof. In one aspect, the electrically conductive particles are selected from fibers having an electrically conductive coating.

Generally the major dimension (e.g., length in the case of fibers) of the elongated particles ranges over an average particle size from about 10 μm to about 200 μm, with lower particle sizes being selected for smaller pitch applications. The base material may be a non-conductive material, such as glass. Any known electrically conductive coating can be used, for example, metal coatings. Commercially available elongated electrically conductive particles are available as Conduct-O-Fil® silver-coated particles from Potters Industries, Valley Forge, Pa.

In another embodiment, elongated particles such as fibers are used in combination with particles having other shapes including spherical and/or irregular shape. Generally the major dimension (e.g., diameter in the case of spherical particles, which diameter is also the minor dimension in the special case of spherical particles) of the spherical and irregular particles ranges over an average particle size from about 2 μm to about 80 μm, with lower particle sizes being selected for smaller pitch applications. In one aspect, such secondary particles, which can be conductive or non-conductive, can be used to determine the bond line thickness when the electronic elements are bonded.

In another aspect, the minor dimension of the elongated particles is used to control the adhesive bond thickness. In this aspect, the level of optional non-elongated particles is kept low enough to not undesirably increase the bond thickness.

In one aspect of the present invention, the maximum average particle size of the spherical and/or irregular particles is not substantially greater than the minor dimension (e.g., width or diameter of fibers) of the elongated particles. As used herein, "substantially greater" means at least about 15%, more preferably at least about 25% greater, and in some cases 50%, 100%, 200% or even greater. In other aspects when the maximum average particle size of the spherical and/or irregular particles is substantially greater than the minor dimension (e.g., width or diameter of fibers) of the elongated particles, then the quantity of non-elongated particles preferably is less (preferably much less) than the quantity of the elongated particles on a weight basis. In another aspect, the quantity of non-elongated particles is at least about 5 wt % less (more preferably at least about 10 wt % less, and in some embodiments at least about 20 wt % less) than the quantity of the elongated particles.

The adhesive film comprising conductive fibers can be used to adhere microprocessor modules into a cavity on a smart card, which card is made for example, of polyvinyl chloride (PVC) or polyester (PET). Card blanks can be, for example, a combination card having a built-in antenna. The modules can be bonded to the cards using an adhesive film and any known bonding method. One such method involves Model ENC 3000 G4 automatic module bonding equipment available from Datacard (Semoy, France).

Process parameters for bonding of fully operational microprocessors to card blanks using automatic equipment include a pretack temperature (temperature sufficiently elevated to render the adhesive tacky, e.g., from about 80° C. to about 200° C., a pretack pressure sufficient to adhere the electronic device to the card, e.g., from about 0.5 bar to about 12 bar, and holding the pretack temperature/pressure conditions for a duration of about 1 to about 10 seconds (more preferably from about 1.5 to about 5 seconds). Further parameters include a bonding head temperature of about 90° C. to about 220° C., with a particular temperatures being selected by quick experiments or adhesive manufacturer's guidelines for similar adhesive chemistry. In addition, the automatic bonding equipment mentioned above also can use cavity preheating (pulse air temperature) from about 0° C. to about 200° C., a heating force of about 50 Newtons (N) to about 100 N (more preferably from about 60 N to about 80 N) with the heating force being held for about 1 to about 10 seconds (more preferably from about 3 to about 7 seconds), and optional (although preferred) cooling at a temperature below bonding temperatures and preferably below ambient and more preferably below about 20° C.

In one aspect of the present invention, the electronic assembly is functionally maintained. That is, adhesion between the electronic elements is not significantly adversely affected and the structural integrity of the electronic assembly involving the durably flexible bond is maintained and, concurrently, at least one electrical pathway between the first electronic element and the second electronic element is maintained for at least a portion of a Flexural Cycle. In one example involving an integrated circuit card such as a "smart card," this means that the reading and/or writing modes of the integrated circuit card remain operational. The resistance through the electrical pathway preferably is maintained below about 30 ohms, more preferably below about 20 ohms or even below about 10 ohms.

The durably flexible bond of the present invention preferably is functionally maintained for at least about 200 Flexural Cycles, more preferably at least about 500, 1000, 2000, 4000, 5000 or even more Flexural Cycles. In one aspect of the present invention, the electronic assembly remains functional after 1000 Flexural Cycles, which should ensure a device such as a smart card including the present invention will function over several years of intended use. In another aspect, the electronic assembly remains functional after 4000 Flexural Cycles, which should ensure a device such as a smart card including the present invention will function despite mistreatment.

For example, a smart card sample having a length of 8.5 cm can be flexed upward to a "new length" of 7.2 cm along with a vertical displacement of 2.4 cm by moving jaws clamped to each end of the card toward the card center, then relaxed to the initial state. Then, this card having a width of 5.4 cm similarly can be flexed upward to a "new width" of 4.6 cm along with a vertical displacement of 1.4 cm, then relaxed to the initial state. Then the card can be flexed downward to a similar "new length", relaxed, and flexed downward to a similar "new width" and vertical displacement and relaxed. This Flexural Cycle takes less than one second, and 1000 Flexural Cycles takes about 20 minutes. Recording resistance before, during, and after flexing in at least one direction as well as 45 minutes after this flexing can provide indications of bond durability. Known anisotropic conductive adhesives degrade or fail upon flexing (resistance increases above about 20 ohms), or show increases in resistance indicating poor durability expectations. The electronic assembly of one aspect of the invention maintains a similar resistance throughout several thousand Flexural Cycles, leading to good to excellent durability expectations. More details are exemplified below, where the invention provides durability throughout several thousand Flexural Cycles.

The durably flexible bond may be resistant to humidity, thermal shock, and/or elevated temperatures. More specifically, the durably flexible bond survives one or more tests such as Humidity Resistance, Thermal Resistance, and/or Thermal Shock Resistance. In preferred embodiments, the bond survives more than one such test. As used herein, "survives" means that the bond is functionally maintained and preferably that the bond and/or electronic assembly is not the weakest link in any device in which it is used.

For example, Humidity Resistance can be measured by conductivity after 7 days (more preferably 10 days or even 14 days) at a temperature of at least about 50° C., more preferably at least about 60° C. or even 65° C. or 70° C., while at a relative humidity of at least about 50%, more preferably at least about 80%, most preferably at least about 90 or even 95%.

For another example, Thermal Shock Resistance can be determined by measuring conductivity after cycling an electronic assembly through temperature changes, such as from a high temperature to a low temperature and back for multiple cycles. The high temperature is at least about 50° C., more preferably at least about 60° C. or 70° C., or even higher (although preferably below the maximum bonding temperature such as about 210° C.). The low temperature is below about 0° C., more preferably below about –20° C., –30° C., –35° C., –40° C., or even lower (although preferably above cryogenic extremes). The number of cycles is at least about 3, more preferably at least about 10, 25, 50, 100, or even more (although 50 cycles is usually sufficient to ensure the electronic assembly with withstand months to years of normal use). One useful combination for Thermal Shock Resistance testing involves measuring conductivity after 50 shocks between 70° C. and –35° C. In these tests, the conductivity after cycling must be sufficient for the function of the electronic assembly.

For yet another example, Thermal Resistance can be determined by measuring conductivity after exposure to elevated temperatures such as at least about 70° C., more preferably at least about 85° C., 100° C., 125° C., 150° C. or even higher, although the maximum temperature may be limited by other components in the electronic assembly. In such a test, the assembly is held at the elevated temperature for at least about 24 hours, more preferably at least about 48, 72, 100, 250, 500, 1000, 1500, or even 2000 hours, and after this exposure the assembly is returned to ambient temperature where the electronic assembly remains functional.

Figure 2:
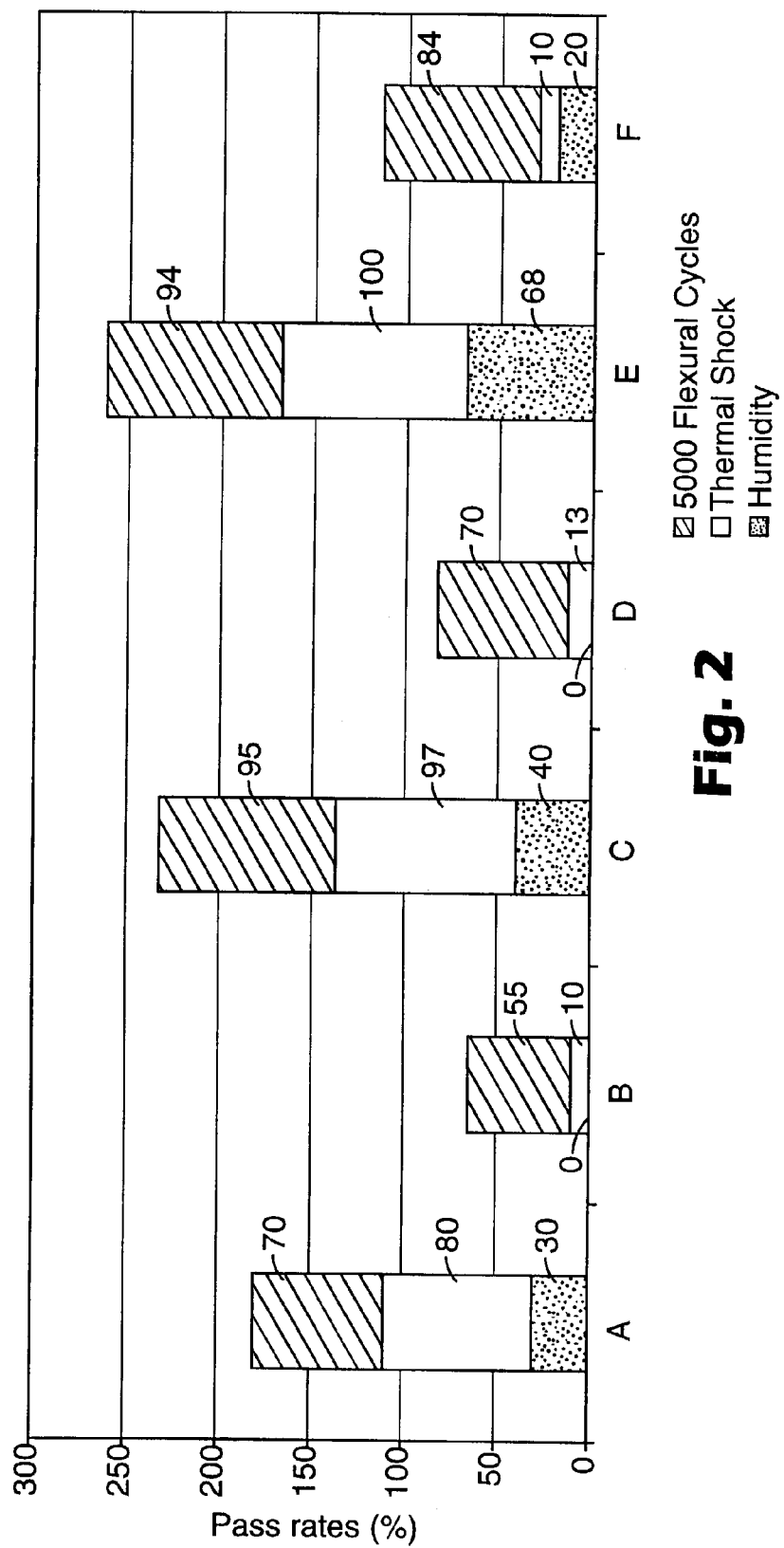
FIG. 2 is a graph comparing the electronic assemblies of the present invention with comparative materials.

FIG. 2 shows the cumulative pass rate for electronic assemblies according to various embodiments of the invention, as well as comparative example assemblies lacking the required features of the present invention. Each test has a maximum pass rate of 100%, so the overall maximum for this chart is 300%. Assembly A (Ex. 1) shows much better performance than Assembly B (C1). Assembly C (Ex. 3) shows much better performance than Assembly D (C2), and it also shows improvement over the previous embodiment of the invention (Assembly A). Assembly E (Ex. 5) shows much better performance than all previous materials, as well as improvement over Assembly F (C3). None of the samples of comparative materials B and D passed the Humidity test, and only 10–13% passed the Thermal Shock test. An overall total for the three tests of at least 100% indicates that further consideration of that electronic assembly is warranted. Comparing the various assemblies for each test shows dramatically better performance for the assemblies according to the present invention. While Assemblies A, C, and E are all superior to the comparative assemblies, Assembly E demonstrates the overall best performance.

Separating the bond between the first and second electronic elements typically destroys one or both electronic elements, one or more contact points, and/or the overall electronic assembly, rendering the electronic assembly nonfunctional. This aspect provides a tamper resistance feature to the assembly.

The adhesive structure of the present invention provides superior electrical performance with features such as lower electrical resistance, higher resistance to mechanical deformation, and/or higher thermal shock resistance than known conductive adhesives with spherical particles.

The adhesive can contain additional components such as thermally conductive, electrically non-conductive particles (which also may be thermally conductive), antioxidants, dyes, pigments, fillers, adhesion promoters, flame retardants, and the like to the extent that they do not interfere with the function and durability of the bond made with the adhesive.

This invention is useful in electronic devices and devices having electronic components and/or subcomponents. One such device is a smart card.

Objects and advantages of this invention are further illustrated by the following examples, but the particular materials and amounts thereof recited in these examples, as well as other conditions and details, should not be construed to unduly limit this invention.

Examples

Materials

Elastomer Butadiene-acrylonitrile copolymer (bound acrylonitrile content 41 weight percent (wt %), available as BREON N41H80 from Zeon Chemicals Europe, Ltd., Sully, South Glamorgan, UK).

Resin Phenolic novolak resin with hexamethylenetetramine (described as having free phenol <0.2% and 9% hexamethylenetetramine, available as 0222 SP 06 from Bakelite AG, Iserlohn-Letmathe, Germany).

Adhesive 1 Polyester-based thermoplastic non-curing bonding film (available from 3M Company, St. Paul, Minn. under the trade designation as 3M™ Thermo-Bond Film 615EG) with Theological properties measured by Rheometrics Dynamic Analyzer (RDA) and as tested according to the test method described below: Tg of 34° C., G' of $1 \times 10^8$ dynes/square centimeter (dyn/sq.cm) (10 megapascals (MPa)), and G" of $5 \times 10^7$ dyn/sq.cm (5 MPa).

Adhesive 2 Polyester-based thermoplastic non-curing bonding film (available from 3M Company, St. Paul, Minn. under the trade designation 3M™ Thermo-Bond Film 668EG) with rheological properties measured by RDA: Tg of 10.8° C., G' of $2 \times 10^7$ dyn/sq.cm (2 MPa), and G" of $1 \times 10^7$ dyn/sq.cm (1 MPa).

Electrically Conductive Particle 1 (ECP 1) Short glass fibers coated with silver (available as Conduct-O-Fil® SF 82TF8 from Potters Industries, Valley Forge, Pa.), described as having an average particle size of 130 μm, D10 of 50 μm and D90 of 175 μm along with 8 wt % silver, and believed to have an average diameter of about 20–30 μm.

Electrically Conductive Particle 2 (ECP 2) Silver-coated glass beads, average particle diameter 43 μm (available as Conduct-O-Fil® S-3000-S3P from Potters Industries).

Test Methods

A. Adhesive Tests 1) 180° Peel Adhesion from PVC and PETF

Specimens of adhesive films having a length of about 200 mm and a width of about 25 mm were bonded to test panels of polyvinyl chloride (PVC) (card available as W/M2 XB 190 μm from ALT in La Garenne Colombes, France) or polyethylene terephthalate (PETF) (polymer film 307 μm thick, available as MELINEX Core 1 from DuPont Co., Wilmington, Del.) using a heated press, using a temperature of 190° C. and pressure of 3 bar ($3 \times 10^5$ Pa) and a bonding time of 5 seconds. A like second sheet was then bonded to the exposed surface of the adhesive film by lamination. 180° peel measurements then were made by grasping the exposed end of the specimen and peeling at 180° at a rate of 150 mm/min using an Instron Model 4301 (from Instron Corp., Canton, Mass.). The test was run on three samples and the average result was recorded in Newtons/centimeter (N/cm).

2) Glass Transition Temperature, Tg ° C.

Dynamic mechanical thermal analysis (DMTA) was employed to indicate the glass transition temperature (Tg) (in ° C.), of an adhesive. Film samples were heated at a rate of 2° C. per minute over a range from –100° C. to 200° C. using a Dynamic Mechanical Thermal Analyzer V available from Rheometric Scientific, Inc., Piscataway, N.J., and thermal transitions were recorded at a frequency of 1 Hertz and a strain of 0.05%. The test was run in tensile mode. The test was run on at least two samples and the average result reported.

3) Rheological Properties

Storage shear modulus (G'), loss shear modulus (G"), and glass transition temperature Tg were determined at 25° C. and 1 Hertz (Hz) using Rheometrics Dynamic Analyzer (RDA) available from Rheometric Scientific. ASTM D5279 generally describes the instrumentation for this test method. Sample films were layered so that a 1–3 mm thick sample was obtained. The sample was placed in the RDA between 8 mm diameter parallel plates, and the RDA was operated at a shear rate of 6.28 radians/second (1 Hertz). Storage shear modulus (G') and loss shear modulus (G") were recorded in dynes/cm$^2$ and converted to megapascals (MPa), and glass transition temperature, Tg, was recorded in degrees Celsius (° C.).

4) Dynamic Shear

Specimens of adhesive films having a length of about 200 mm and a width of about 25 mm were bonded to test panels of etched aluminum so that a 25 mm×25 mm bond area was formed. The bond was made at 140° C. and 2 bar ($2 \times 10^5$ Pa) pressure for 5 minutes for Adhesive 1-based Examples 1, 2, and C1, at 160° C. and 2 bar ($2 \times 10^5$ Pa) pressure for 5 minutes for Adhesive 2-based Examples 3, 4, and C2, and at 190° C. and 5 bar pressure ($5 \times 10^5$ Pa) for 5 minutes for the adhesive of Examples 5, 6, and C3 (below). The bonds were tested at a crosshead speed of 2.5 mm/min. The test was run on 3–4 samples and the average result reported in MPa.

5) Surface Area Percent

The surface area covered by embedded particles was evaluated using a microscope. Articles having embedded particles on their surface were examined at 20× magnification using an OLYMPUS BX60 F5 (available from Olympus Optical Co. Ltd., Japan) microscope equipped with a video camera. A picture was taken of a randomly selected area and the image stored in a digital format for later examination. Several images, each having an area of nearly 1 mm$^2$, were analyzed using SIGMASCAN PRO5 image processing software (available from SPSS Inc., Chicago. Ill.) to obtain the area covered by the particles. The percentage area covered was determined by dividing the average area of all the particles in the samples by the total area of the imaged area. This number was multiplied by 100 to obtain the percentage. The test was run on three samples and the average result reported.

B. Card Related Tests

Card Preparation and Electrical Resistance

Dual interface PVC card blanks with internally embedded antennas and electronic connections (available as Dual interface Version Ohne Modul Menge S 13 from ACG France, Palaiseau Cedex, France) were bonded to dummy microprocessor modules using the bonding procedure described in industry standards, i.e., at 180° C. and 9 bar ($9 \times 10^5$ Pa) pressure for 5 seconds, using automatic module bonding equipment (available as Model ENC 3000 G4 from Datacard). The adhesive films prepared in the examples were used to make a total of about 200 bonded cards with each example adhesive. The electrical resistance in ohms was measured using an ohmmeter (Fluke 83 III Multimeter from Fluke Corp., Everett, Wash.) by contacting two exposed measurement points provided on the dummy module. The resistance includes that of the dummy module and the embedded antenna. All of the cards were evaluated for resistance initially and after being subjected to one of the stress tests.

1) Initial Resistance

Electrical resistance was measured directly after bonding. The test was run on 80–150 cards prepared from each example adhesive, and the average of all cards was reported.

2) Flexural Cycle Test

The bonded card was tested according to ISO\ICE 10373 Parts 1–3 using testing equipment available as "Twister" from Datacard. The test included flexing in four modes at 23° C. The modes were: bending up 20 mm (in the length by moving jaws holding each card end toward the card center) followed by returning to the original position and repeating 250 times; bending up 10 mm (in the width by moving jaws holding each card side toward the card center) followed by returning to the original position and repeating 250 times; similarly bending down 20 mm (in the length) followed by returning to the original position and repeating 250 times; and similarly bending down 10 mm (in the width) followed by returning to the original position and repeating 250 times. This resulted in 1000 Flexural Cycles, which took about 20 minutes. This test was repeated to perform several thousand Flexural Cycles in increments of 1000 as described, and the results are reported below. The test was run on a minimum of 20 cards prepared from each example adhesive.

3) Humidity Aging

Bonded cards were exposed to 65° C. and 95% relative humidity for 10 days. The test was run on a minimum of 20 cards prepared from each example adhesive, within a few minutes of being removed from the humid environment.

4) Thermal Shock

Bonded cards were exposed to a temperature of −35° C. for 15 minutes, then moved from the cold environment (within 1 minute) to an oven at a temperature of 70° C. where the cards were held for 15 minutes. Then the cards were moved from the oven (within 1 minute) to the cold environment (−35° C.). This temperature cycle was repeated for 50 cycles. The test was preformed within a few minutes of completion of the thermal shock cycling. The test was run on a minimum of 20 cards prepared from each example adhesive.

In this test, "pass" means that that an individual bonded card had a measured resistance of 20 ohms or less, "damaged card" means that an individual bonded card had a measured resistance above 20 ohms, and "open" means that an individual bonded card had an infinite resistance (disconnected card or open circuit). The table below includes the results for percent "pass" and percent "open" for a minimum of 20 cards for each test result.

5) Module Adhesion

Modules were bonded into cards as described above (Card Preparation). A small section of the card under the module was then cut away, allowing access to the rear of the module. The card was then held in a jig in a tensile tester and a cylindrical probe having a flat end of 6.5 mm diameter was advanced towards the bonded module from the rear side of the card at a crosshead speed of 10 mm/min. Maximum force at breakage of the bond was recorded in Newtons. The test was run on 3–4 cards per example adhesive and the average result was reported.

6) Module Removal Test (Tamper Resistance)

This is a measure of tamper resistance. The module should not be removable from the card without self-destruction or damage to the module that makes it impossible to use or transfer data from it to another card. The test is a subjective indication of tamper-resistance of the card-to-module bond. Common tampering techniques were employed in attempts to remove the module intact. These include peeling off manually. Bonded assemblies where the module could not be removed without ruining it were denoted as "+". Bonded assemblies where the module could be removed without damage to the module and/or card were denoted "−". Bonded assemblies where the module could be removed with some damage to the module and/or card but without completely ruining it were denoted an intermediate result of "(+/−)".

Particle Embedding

In Examples 1–6, various coated webs were embedded with particles using an apparatus with a reservoir having a screened opening along with agitating the reservoir and a brush to aid particle dispensing. One example of a suitable apparatus is fully described in U.S. Pat. No. 6,569,494. the disclosure of which is herein incorporated by reference. More specifically, an electrically grounded heating plate was used to soften the adhesive to a tacky state, and then particles were sprinkled onto the adhesive web from a reservoir. This reservoir had a rectangular opening in its front wall (closest to the adhesive web). The opening was covered with a nylon screen typically used in screen-printing (80 μm size, commercially available from Saati America's Majestic Division, Somers, N.Y.). The particles were electrically charged at high voltage (typically at 7 kV) to keep them well dispersed during sprinkling. A paint roller brush made of synthetic fibered felt backing (commercially available from Collins & Aitken Co., New York. N.Y.) was rotated while in contact with the nylon screen to help dispense the particles through the screen. The rotation speed of the brush was varied by applying a DC voltage (in the range of 0.6 V to 12 V) to a motor turning the brash at 3 to 90 rotations per minute (rpm), which controlled the dispense rate. A value of 4 V (29 rpm) provided a surface area percent of from 10% to 14%. To facilitate uniform dispensing, the particles in the reservoir were stirred mechanically. After sprinkling the particles, the web was passed through the nip of two rolls to further embed the dispersed particles into the adhesive web.

All of the examples were performed in a humidity-controlled environment. Typical relative humidity inside the apparatus was kept below about 10% and the ambient temperature was around 30° C.

Examples 1 and 2

ECP 1 particles were embedded in a film of Adhesive 1 using the general process and device described above. The following parameters were used: a web speed of 0.46 meters/minute (m/min) (1.5 feet/min (fpm)), a heating plate temperature of 90° C., a distance of 30 mm between the charging wire on the brush and the heating plate, and an operating voltage of 4 volts (V) for the rotating brush. A negative DC potential of 7 kV was applied to the dispensing device. The coated adhesive film was sent through the nip of two silicone rubber rolls set at a nip pressure of 20 pounds per square inch (psi) (0.138 MPa).

The adhesive film comprising conductive fibers was then used to adhere dummy microprocessor modules into a cavity on a smart card made of PVC. The modules were bonded to the PVC cards using the adhesive film of Example 1 using the bonding equipment described above.

Process parameters for bonding of fully operational microprocessors to card blanks using automatic equipment include:

Pretack temperature: 100° C. for Examples 1, 2, and C1; 160° C. for Examples 3, 4, and C2; and 150° C. for Examples 5, 6, and C3. Pretack pressure: 5.5 Bar. Pretack duration: 1.5 to 4.5 seconds. Bonding head temperature: 160° C. for Exs. 1, 2, and C1; 190° C. for Exs. 3, 4, and C2; and 200° C. for Exs. 5, 6, and C3. Cavity preheating (pulse air temperature): 0 to 200° C. Heating force: 62 to 78.5 Newtons for 5–6 seconds. Cooling at 15° C.: continuous.

Example 2 was made as in Example 1 except: (1) a mixture of electrically conductive particles was embedded in the surface of the adhesive. The applied mixture of conductive particles comprised 50 pbw ECP 1 particles and 50 pbw ECP 2 particles; and (2) process parameters for applying the mixture of conductive particles to the adhesive film were adjusted so that the web moved at 4.6 m/min (15 fpm) and an operating voltage of 2.5 V for the rotating brush (17 rpm).

Tests were conducted on the adhesive film by the Test Methods described above. Properties of the adhesive film are summarized in Table 1. All adhesive films had a thickness of about 60 µm. Test results on the bonded cards are summarized in Table 2.

Examples 3 and 4

In Example 3, ECP 1 particles were applied to Adhesive 2 by essentially the same method as employed in Example 1 while in Example 4, the particle mixture of Example 2 was applied to Adhesive 2 by the method of Example 2.

Examples 5 and 6

A solution of 55 parts by weight (pbw) Elastomer and 45 pbw Resin was prepared by first dissolving Elastomer in methyl ethyl ketone (MEK) and then adding Resin. After dissolution was completed by mixing, toluene was added so that the solvent ratio was MEK/toluene 80/20 pbw weight. Viscosity of the solution was about 5,000–10,000 mPa. sec.

The solution thus prepared was coated onto a release liner comprising a silicone-coated paper using a knife coater so that the coating had a thickness of about 200 µm. The coating was dried using a forced air oven at a minimum temperature effective to remove the solvent of about 60° C. to give a non-tacky film having a thickness of about 60 µm. The non-tacky film was tested for Rheological Properties using the test method described above. The results were a Tg of 36.3° C., G' of $3 \times 10^8$ dyn/sq.cm (30 MPa), and G" of $2.5 \times 10^8$ dyn/sq.cm (25 MPa). ECP 1 particles were applied to the film by essentially the same method as employed in Example 1.

Example 5 showed, in particular, that a low number of cards were damaged after exposure to the three aging tests, respectively, including humidity (only 10% damaged), thermal shock (no cards damaged) and the flexing test (only 6% cards damaged).

Example 6 was prepared by the same method as Example 5 except that the particle mixture of Example 2 was applied to the adhesive of Example 5 by the method of Example 2.

Comparative Examples 1–3 (C1, C2, C3)

Adhesive films having the adhesive compositions of Adhesive 1, Adhesive 2, and Example 5, respectively, were subjected to a process whereby only silver-coated glass spheres were embedded in their surface. Process variables were the same as those employed for mixtures of fibers and spheres: a heated plate temperature of 90° C. was employed, a web speed of 4.6 m/min (15 ft/min), an operating voltage of 1.8 V for the rotating brush (12 rpm) to provide 14 SA % particles, a negative DC potential of 7 kV and a silicone roll nip pressure of 20 psi (0.138 MPa).

C1 was made as shown in Example 1, above, except that ECP 2 particles were used instead of ECP 1 particles. C2 was made as shown in Example 3 above, except that ECP 2 particles were used instead of ECP 1 particles. C3 was made as shown in Example 5, above, except that ECP 2 particles were used instead of ECP 1 particles.

TABLE 1

Material Properties

| Ex. | Surface Area % (SA %) | 180 Peel adhesion, N/cm (PVC) | 180 Peel adhesion, N/cm (PETF) | Tg, ° C. (DMTA) | Dynamic Shear, MPa |
|---|---|---|---|---|---|
| 1 | 14 | 14.7 | 0.6 | 31.0 | 2.2 |
| 2 | 10 | 14.2 | 0.7 | 34.2 | 2.8 |
| 3 | 14 | 13.0 | 2.1 | 7.0 | 3.9 |
| 4 | 10 | 12.0 | 1.9 | 4.6 | 5.1 |
| 5 | 14 | 8.8 | 8.8 | 35.7 | 6.4 |
| 6 | 10 | 12.0 | 6.5 | 36.3 | 3.0 |
| C1 | 13 | 12.8 | 1.3 | 32.3 | 5.9 |
| C2 | 13 | 7.0 | 3.3 | 5.0 | 4.0 |
| C3 | 13 | 12.6 | 9.1 | 35.0 | 3.8 |

TABLE 2

Test Results

| Ex. | Initial Resistance Ohms | Module Adhesion N | Tamper Resistance (+/−) |
|---|---|---|---|
| 1 | 4.2 | 146 | − |
| 2 | 4.5 | 144 | − |
| C1 | 5.4 | 123 | − |
| 3 | 4.2 | 142 | +/− |
| 4 | 4.2 | 146 | +/− |
| C2 | 4.4 | 107 | +/− |
| 5 | 4.0 | 141 | + |
| 6 | 4.0 | 134 | + |
| C3 | 3.9 | 157 | + |

TABLE 3

Card Test Results

| Ex. | Humidity Pass | Humidity Open | Thermal Shock Pass | Thermal Shock Open | 5000 Flexural Cycles Pass | 5000 Flexural Cycles Open |
|---|---|---|---|---|---|---|
| 1 | 30 | 4 | 80 | 7 | 70 | 15 |
| 2 | 11 | 27 | 83 | 0 | 20 | 75 |
| C1 | 0 | 72 | 10 | 40 | 55 | 30 |
| 3 | 40 | 40 | 97 | 3 | 95 | 0 |
| 4 | 0 | 84 | 13 | 40 | 75 | 10 |
| C2 | 0 | 92 | 13 | 57 | 70 | 10 |
| 5 | 68 | 10 | 100 | 0 | 94 | 6 |
| 6 | 50 | 10 | 0 | 37 | 80 | 20 |
| C3 | 20 | 15 | 10 | 25 | 84 | 8 |

It is apparent to those skilled in the art from the above description that various modifications can be made without departing from the scope and principles of this invention, and it should be understood that this invention is not to be unduly limited to the illustrative embodiments set forth hereinabove. All publications and patents are herein incorporated by reference to the same extent as if each individual publication or patent was specifically and individually indicated to be incorporated by reference.

We claim:

1. An electronic assembly comprising:
   a first electronic element;
   a second electronic element; and a durably flexible bond therebetween, said bond comprising
an anisotropic conductive adhesive which comprises elongated electrically conductive particles, wherein the adhesive has a storage shear modulus selected from below about 100 MPa, below about 75 MPa, and below about 50 MPa, and
at least one electrical pathway between the first electronic element and the second electronic element provided by an elongated contact region,
said bond is capable of being functionally maintained for at least about 200 Flexural Cycles.

2. The assembly of claim 1 wherein the elongated electrically conductive particles are selected from non-spherical particles, elliptical particles, fibers, and flakes and combinations thereof.

3. The assembly of claim 1 wherein the electrically conductive particles are selected from fibers having an electrically conductive coating.

4. The assembly of claim 1 wherein said bond is capable of being functionally maintained for a number of Flexural Cycles selected from at least about 500, at least about 1000, at least about 2000, at least about 4000, and at least about 5000.

5. The assembly or claim 1 wherein the adhesive is curable.

6. The assembly of claim 1 wherein the adhesive is a structural adhesive.

7. The assembly of claim 1 wherein the Tg of the adhesive does not change by more than 25° C. after curing.

8. The assembly of claim 1 wherein the adhesive is curable in less than about 10 seconds at a temperature below about 210° C.

9. The assembly of claim 1 wherein the adhesive is thermoplastic.

10. The assembly of claim 9 wherein the adhesive is selected from polyesters, co-polyamides, polyether-co-polyamides, and combinations thereof.

11. The assembly of claim 1 wherein said bond is resistant to humidity.

12. The assembly of claim 1 wherein said bond is resistant to thermal shock and/or temperatures above about 200° C. for at least about 100 hours.

13. The assembly of claim 1 wherein the adhesive comprises from about 30 to about 70 parts by weight of an elastomer and correspondingly from about 70 to 30 parts by weight of a curable polymer.

14. The assembly of claim 13 wherein the elastomer is selected from natural and synthetic rubbers, fluoroelastomers, and silicone elastomers, and combinations thereof.

15. The assembly of claim 13 wherein the elastomer is selected from butadiene-acrylonitrile copolymer, and optionally wherein the curable polymer is selected from an epoxy resin, a polyurethane resin, a phenolic resin, a phenolic novolac resin, and combinations thereof, wherein when a phenolic resin is involved, said resin optionally may include hexamethylenetetramine (HMTA).

16. The assembly of claim 15 wherein the phenolic resin has a melting point between about 90 and about 110° C.

17. The assembly of claim 15 wherein the phenolic resin has an HMTA content in the range of about 5 to 15%, optionally in the range from about 6 to 10%.

18. The assembly of claim 15 wherein the phenolic resin has a free phenol level selected from below about 2%, below about 1%, and below about 0.2%.

19. The assembly of claim 1 wherein the adhesive comprises from about 30 to about 60 parts by weight of an elastomer and at least about 40 parts by weight of a curable polymer.

20. The assembly of claim 1 wherein the adhesive comprises at least about 50 parts by weight of an elastomer and at least about 30 parts by weight of a curable polymer.

21. The assembly of claim 1 wherein the adhesive comprises from about 45 to about 60 parts by weight of an elastomor and at least about 40 parts by weight of a curable polymer.

22. The assembly of claim 1 wherein the adhesive comprises an elastomer and a thermoplastic polymer.

23. The assembly of claim 1 wherein one electronic element is an integrated circuit chip contact.

24. The assembly of claim 1 wherein one electronic element is a flexible electronic circuit.

25. The assembly of claim 24 wherein one electronic element is rigid.

26. The assembly of claim 1 wherein the electronic assembly is a smart card or is included in a smart card.

27. The assembly of claim 1 wherein one electronic element is a radio frequency device or is included in a radio frequency device, which optionally is an RFID tag.

28. The assembly of claim 1 wherein one electronic element is included in an portable electronic device, optionally selected from a mobile phone, a personal digital assistant, a camera, a computer, a timer, and combinations thereof.

29. The assembly of claim 1 wherein the electronic assembly is tamper resistant.

30. The assembly of claim 1 further comprising non-elongated particles, wherein the non-elongated particles optionally comprise electrically conductive particles.

31. The assembly of claim 30 wherein the non-elongated particles have a major dimension average particle size less than a minor dimension average particle size of the elongated electrically conductive particles.

32. The assembly of claim 30 wherein the elongated particles comprise a majority of the total of elongated particles and non-elongated particles on a weight basis.

33. The assembly of claim 30 wherein the assembly has a Humidity test pass rate of at least about 10%, a Thermal Shock test pass rate of at least about 15%, and a 5000 Flexural Cycle test pass rate of at least about 60%.

34. A method of manufacturing an electronic device comprising providing the assembly of claim 1 wherein the adhesive is curable; and curing said adhesive or wherein the adhesive is non-curing; and bonding said adhesive to said electronic elements.

* * * * *

UNITED STATES PATENT AND TRADEMARK OFFICE
CERTIFICATE OF CORRECTION

PATENT NO. : 7,034,403 B2  Page 1 of 1
APPLICATION NO. : 10/411163
DATED : April 25, 2006
INVENTOR(S) : Ranjith Divigalpitiya It is certified that error appears in the above-identified patent and that said Letters Patent is hereby corrected as shown below:

Title Page 2, Foreign Patent Documents
Line 2, after "1/1996" insert --1/22--

Column 4
Line 39, delete "pry-coating" and insert --pre-coating--

Column 9
Line 16, delete "Theological" and insert --rheological--

Column 12
Line 9, delete "6,569,494." and insert --6,569,494,--

Column 15
Line 25, delete "or" and insert --of--

Column 16
Line 16, delete "elastomor" and insert --elastomer--

Signed and Sealed this

Ninth Day of January, 2007

JON W. DUDAS
*Director of the United States Patent and Trademark Office*